United States Patent
Brooks et al.

(10) Patent No.: US 7,223,697 B2
(45) Date of Patent: May 29, 2007

(54) CHEMICAL MECHANICAL POLISHING METHOD

(75) Inventors: Garth A. Brooks, St. Albans, VT (US);
Bruce W. Porth, Jericho, VT (US);
Steven M. Shank, Jericho, VT (US);
Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 10/710,604

(22) Filed: Jul. 23, 2004

(65) Prior Publication Data
US 2006/0063326 A1 Mar. 23, 2006

(51) Int. Cl.
*H01L 21/302* (2006.01)

(52) U.S. Cl. .............. 438/692; 438/693; 257/E21.304

(58) Field of Classification Search ........ 438/243–248, 438/386–392, 689–697; 257/E21.304; 156/345.12
See application file for complete search history.

(56) References Cited

U.S. PATENT DOCUMENTS

| | | | |
|---|---|---|---|
| 5,104,828 A | 4/1992 | Morimoto et al. | |
| 5,196,353 A * | 3/1993 | Sandhu et al. | 438/5 |
| 5,300,155 A | 4/1994 | Sandhu et al. | |
| 5,998,821 A * | 12/1999 | Hieda et al. | 257/301 |
| 6,680,237 B2 * | 1/2004 | Chen et al. | 438/386 |
| 2003/0013387 A1 | 1/2003 | Tsai et al. | |

FOREIGN PATENT DOCUMENTS

JP 2001144063 5/2001

\* cited by examiner

*Primary Examiner*—Brook Kebede
(74) *Attorney, Agent, or Firm*—Schmeiser, Olson & Watts; William D. Sabo

(57) ABSTRACT

A method of forming a structure, an array of structures and a memory cell, the method of fabricating a structure, including: (a) forming a trench in a substrate; (b) depositing a first layer of polysilicon on a surface of the substrate, the first layer of polysilicon filling the trench; (c) chemical-mechanical-polishing the first layer of polysilicon at a first temperature to expose the surface of the substrate; (d) removing an upper portion of the first polysilicon from the trench; (e) depositing a second layer of polysilicon on the surface of the substrate, the second layer of polysilicon filling the trench; and (f) chemical-mechanical-polishing the second layer of polysilicon at a second temperature to expose the surface of the substrate, the second temperature different from the first temperature.

38 Claims, 9 Drawing Sheets

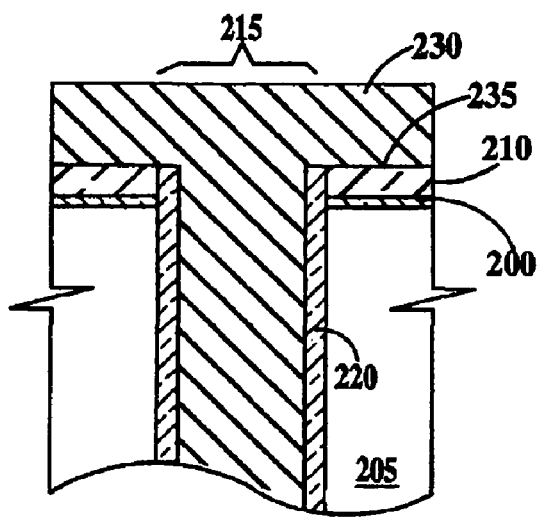
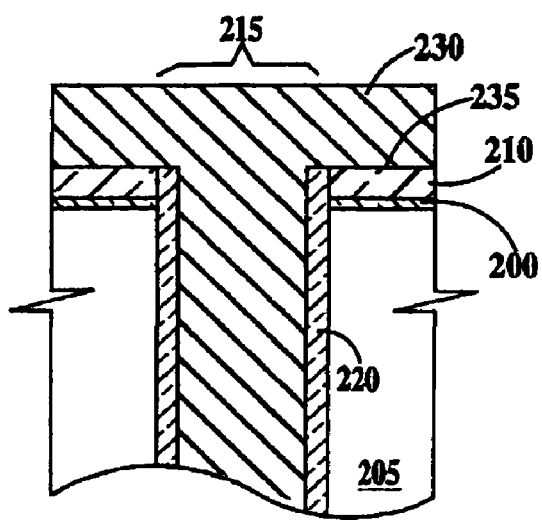
*FIG. 3A*  *FIG. 4A*
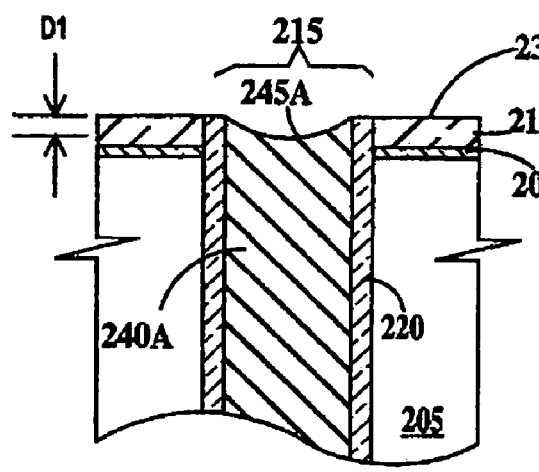
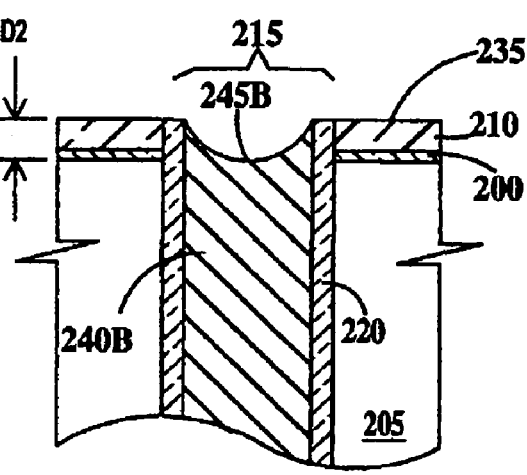
*FIG. 3B*  *FIG. 4B*
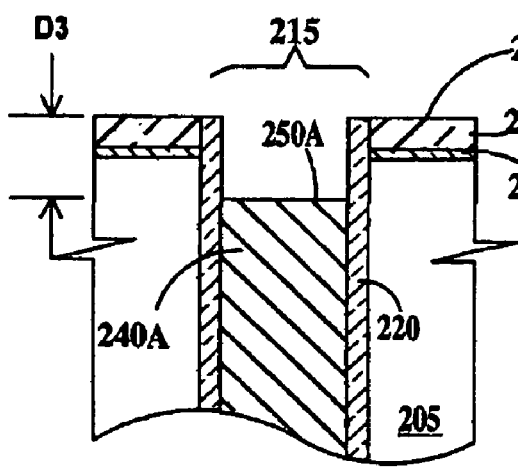
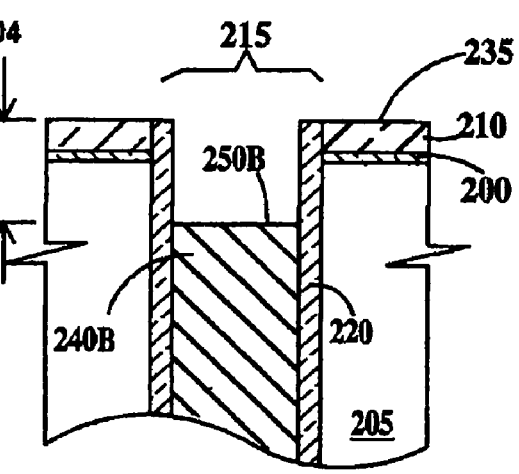
*FIG. 3C*  *FIG. 4C*

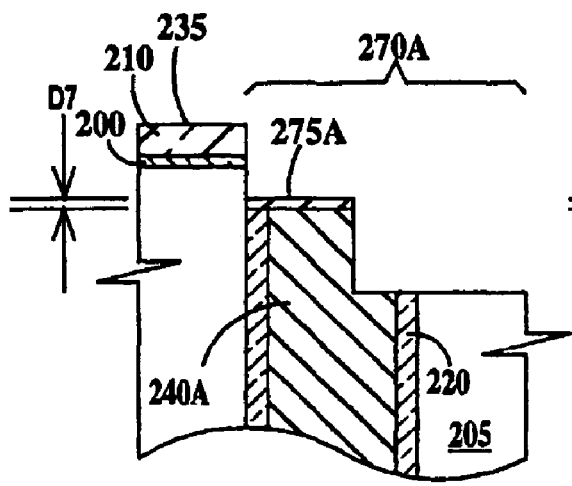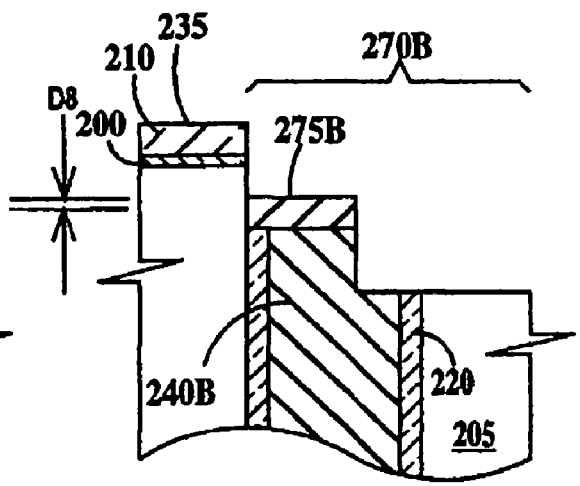
*FIG. 3G*  *FIG. 4G*
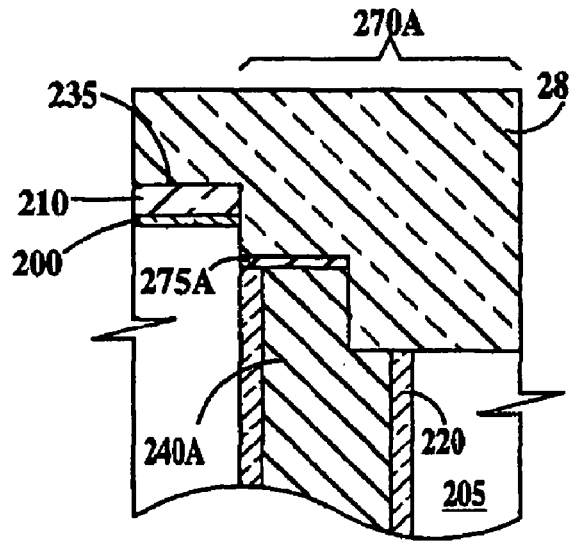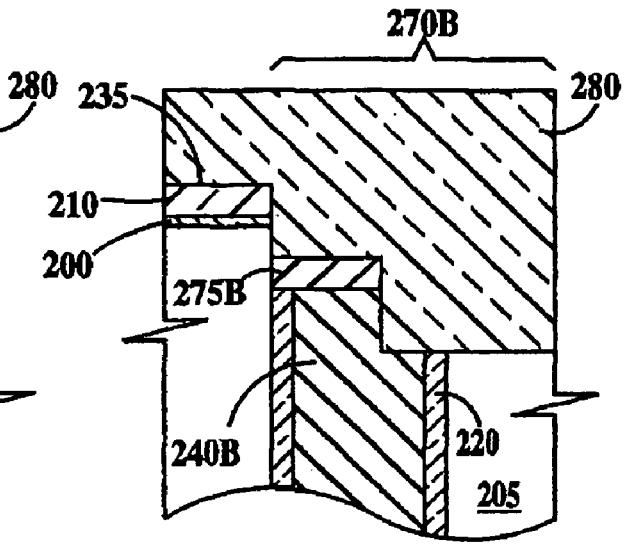
*FIG. 3H*  *FIG. 4H*
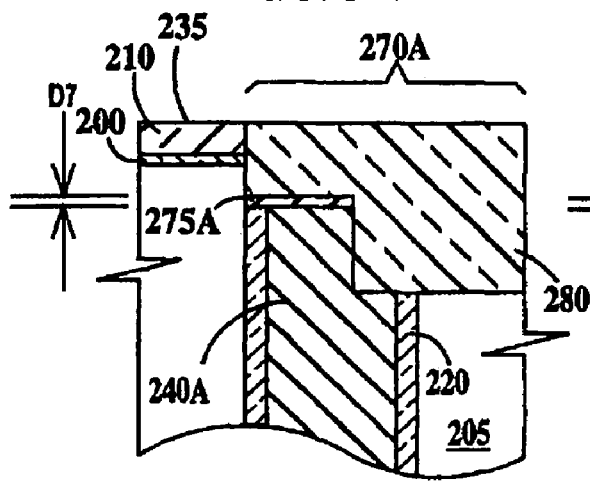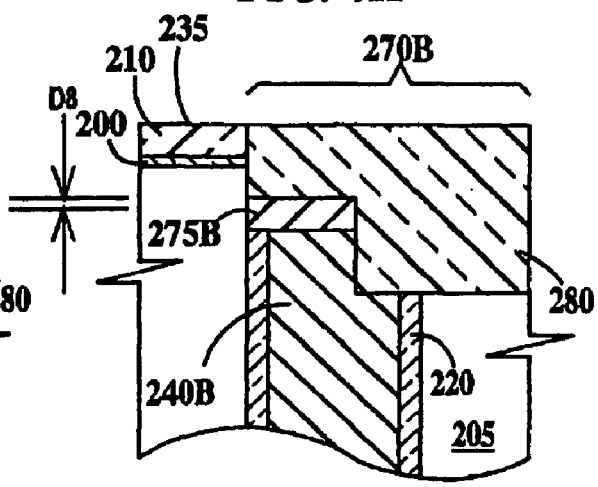
*FIG. 3I*  *FIG. 4I*

CHEMICAL MECHANICAL POLISHING METHOD

BACKGROUND ART

1. Field of the Invention

The present invention relates to the field of integrated circuit fabrication; more specifically, it relates to a chemical-mechanical-polish method of fabricating integrated circuits.

2. Background of the Invention

Chemical mechanical processing for planarizing surfaces of semiconductor substrates is a technique that effects vertical dimensions of semiconductor structures. As integrated circuit devices become ever smaller in both the horizontal and vertical directions, control of vertical dimensions has become as important as control of horizontal dimensions in effecting yield and reliability. Therefore there is an ongoing need for chemical mechanical polishing processes with improved vertical dimension control.

SUMMARY OF THE INVENTION

A first aspect of the present invention is a method of fabricating a structure, comprising: (a) forming a trench in a substrate; (b) depositing a first layer of polysilicon on a surface of the substrate, the first layer of polysilicon filling the trench; (c) chemical-mechanical-polishing the first layer of polysilicon at a first temperature to expose the surface of the substrate; (d) removing an upper portion of the first polysilicon from the trench; (e) depositing a second layer of polysilicon on the surface of the substrate, the second layer of polysilicon filling the trench; and (f) chemical-mechanical-polishing the second layer of polysilicon at a second temperature to expose the surface of the substrate, the second temperature different from the first temperature.

A second aspect of the present invention is a method of fabricating a structure, comprising: (a) forming an array of trenches in a substrate; (b) depositing a first layer of polysilicon on a surface of the substrate, the first layer of polysilicon filling the trenches; (c) chemical-mechanical-polishing the first layer of polysilicon at a first temperature to expose the surface of the substrate, the first layer of polysilicon in the trenches dished into the trench a first distance from surface of the substrate; (d) removing an upper portion of the first polysilicon from each of the trenches; (e) depositing a second layer of polysilicon on the surface of the substrate, the second layer of polysilicon filling the trenches; and (f) chemical-mechanical-polishing the second layer of polysilicon at a second temperature to expose the surface of the substrate, the second temperature different from the first temperature, the second layer of polysilicon in the trenches dished into the trench a second distance from surface of the substrate, the first distance greater than the second distance.

A third aspect of the present invention is a method of fabricating memory cell, comprising: (a) forming a trench in a substrate and forming a dielectric layer on a sidewall of said trench; (b) depositing a first layer of polysilicon on a surface of said substrate, said first layer of polysilicon filling said trench; (c) chemical-mechanical-polishing said first layer of polysilicon at a first temperature to expose said surface of said substrate; (d) removing an upper portion of said first polysilicon from said trench; (e) depositing a second layer of polysilicon on said surface of said substrate, said second layer of polysilicon filling said trench; (f) chemical-mechanical-polishing said second layer of polysilicon at a second temperature to expose said surface of said substrate, said second temperature different from said first temperature; (g) removing an upper portion of said second layer of polysilicon from said trench and refilling said trench with an insulator; and (h) forming a NFET in said substrate and adjacent to said trench, a source of said NFET in physical and electrical contact with said second layer of polysilicon in said trench.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 3A through 3I are partial cross-sectional views illustrating a nominal chemical mechanical polish process sequence for fabricating an exemplary semiconductor structure;

FIGS. 4A through 4I are partial cross-sectional views illustrating a chemical mechanical polish process sequence for fabricating an exemplary polysilicon semiconductor structure according to the present invention;

DETAILED DESCRIPTION OF THE INVENTION

Figure 1:
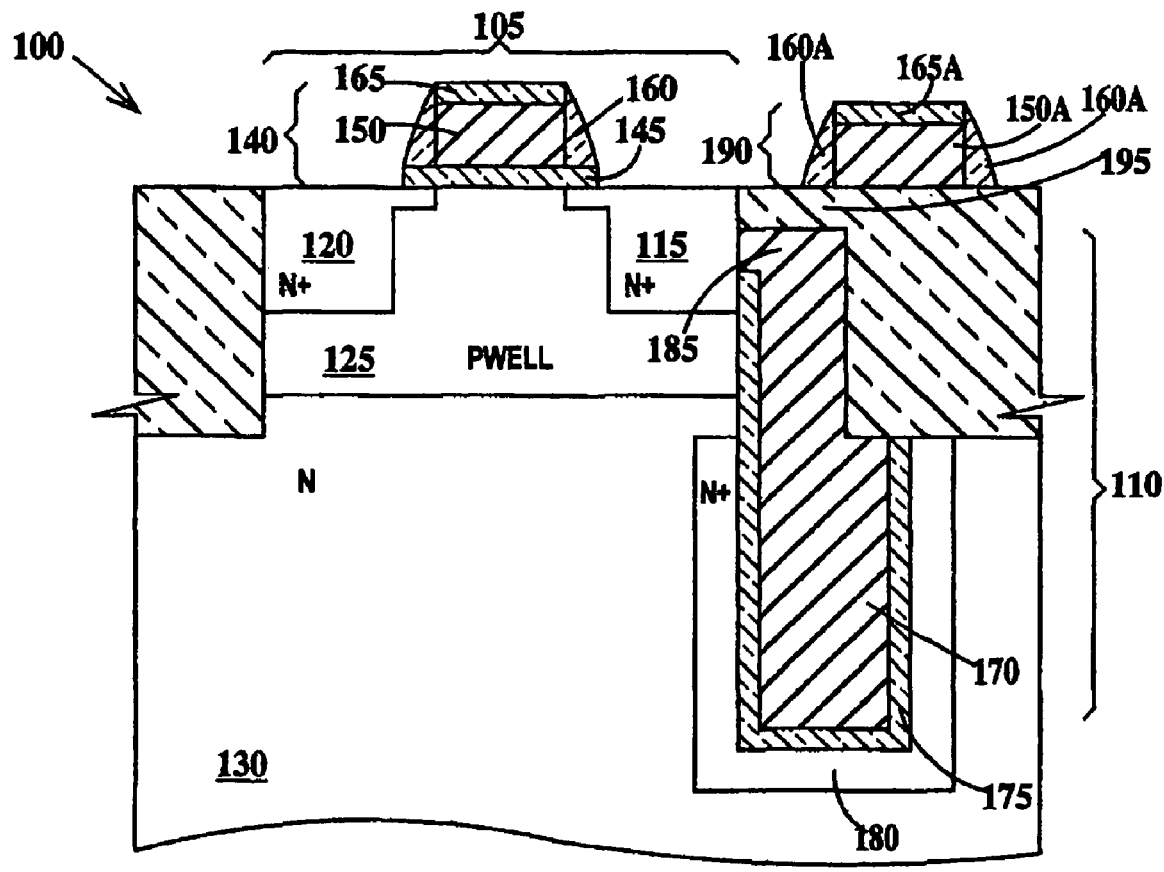
FIG. 1 is cross-sectional drawing of a dynamic random access memory cell that is exemplary of a semiconductor device that may be fabricated using the present invention.

FIG. 1 is cross-sectional drawing of a dynamic random access memory cell that is exemplary of a semiconductor device that may be fabricated using the present invention. In FIG. 1, a dynamic random access memory (DRAM) cell 100 includes a N-channel field effect transistor (NFET) 105 and a trench capacitor 110. NFET 105 includes a source 115 and a drain 120 formed in a P-well 125, all formed in an N-type substrate 130. A gate 140 of NFET 105 includes a gate dielectric 145 between a bottom surface of gate conductor 150 and a top surface of substrate 155. Formed on sidewalls of gate conductor 150 are dielectric spacers 160. A dielectric cap 165 is formed on a top surface of gate conductor 150. Trench capacitor 110 includes a polysilicon first plate 170, a capacitor dielectric layer 175 and an optionally heavily doped N+ silicon region 180 surrounding a lowermost portion of capacitor dielectric layer 175. N+ silicon region 180 acts a second plate of trench capacitor 110. Source 115 of NFET 105 is physically and electrically connected to polysilicon first plate 170 by a polysilicon buried strap 185. A passing wordline 190 is prevented from shorting to buried strap 185 by a dielectric layer 195 intervening between a bottom surface of a gate conductor 150A and the buried strap. Passing wordline 190 also includes dielectric spacers 160A formed on sidewalls of gate conductor 160A and a dielectric cap 165A is formed on a top surface of the gate conductor. As will be described infra, buried strap 185 may be formed according to the present invention.

Figure 2:
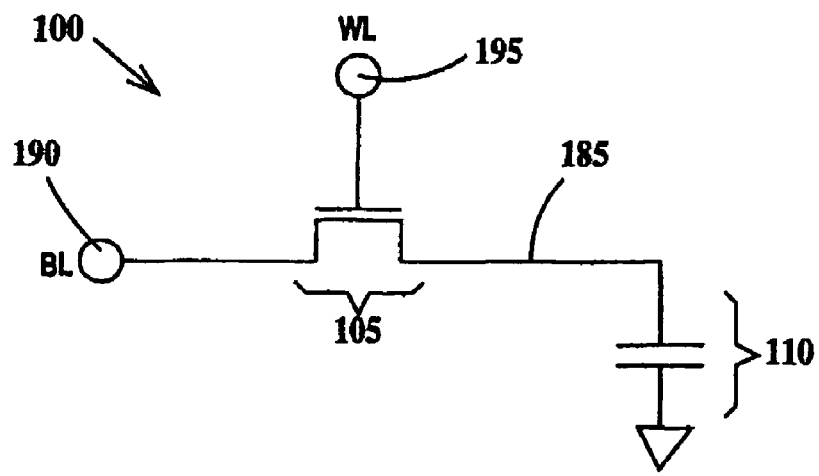
FIG. 2 is a circuit diagram of the dynamic random access memory cell of FIG. 1.

FIG. 2 is a circuit diagram of the dynamic random access memory cell of FIG. 1. In FIG. 2, the drain of NFET 105 is connected to a bitline contact 190, the source of NFET 105 is coupled to ground through trench capacitor 110 and the gate NFET 105 is connected to a wordline contact 195. The connection provided by buried strap 185 is indicated.

Control of the thickness, and thus resistance of buried strap 185 (see also FIG. 1) effects the performance of DRAM cell 100. Lower buried strap resistance and hence a thicker buried straps is desirable. The thickness of buried strap may be directly affected by two polysilicon chemical-mechanical-polish (CMP) steps used in the fabrication of the buried strap. However, while the present invention is illustrated using fabrication of a buried strap connection to a trench capacitor, the present invention is applicable to any multi-step polysilicon fill process.

FIGS. 3A through 3I are partial cross-sectional views illustrating a nominal chemical mechanical polish process sequence for fabricating an exemplary semiconductor structure. FIGS. 4A through 4I are partial cross-sectional views illustrating a chemical mechanical polish process sequence for fabricating an exemplary polysilicon semiconductor structure according to the present invention.

In FIG. 3A, a pad oxide layer 200 is formed on a top surface of a silicon substrate 205 and a pad nitride layer 210 is formed on a top surface of the pad oxide layer. Pad nitride layer 210 is a CMP etch/polish stop layer. A trench 215 is formed through pad oxide layer 200 and pad nitride layer 210 into substrate 205. A collar oxide layer 220 is formed on sidewalls of trench 215. A first layer of polysilicon 230 is deposited on a top surface 235 of pad nitride layer 210 of a sufficient depth to fill trench 215. In one example, pad oxide layer 200 is thermal silicon oxide and is about 4 nm to about 8 nm thick. In one example, pad nitride layer 210 is silicon nitride and is about 100 nm to about 300 nm thick. In one example, polysilicon layer 230 is N-doped polysilicon and is about 200 nm to about 400 nm thick. FIG. 4A is identical to FIG. 3A.

In FIG. 3B, a first CMP process maintained at a temperature T1 and using a slurry comprised of, for example, water, silicon oxide particles, tetramethyl ammonium hydroxide and aluminum sulfate is used to planarize polysilicon layer 230 (see FIG. 3A) forming a first silicon plug 240A. During CMP some of pad nitride layer 210 is polished away as discussed infra. Also, during CMP a dished surface 245A is formed in the polysilicon plug whose depth of dishing D1 is a function of temperature T1 and the density of structures surrounding first polysilicon plug 240A.

FIG. 4B is similar to FIG. 3B except a otherwise identical first CMP process to that described in reference to FIG. 3B maintained at a temperature T2 is used to planarize polysilicon layer 230 (see FIG. 4A) forming a first silicon plug 240B. During CMP some of pad nitride layer 210 is polished away as discussed infra. Also, during CMP a dished surface 245B of whose depth of dishing D2 is a function of temperature T2 to a first order and the density of structures surrounding polysilicon plug 240B to a second order is formed in the polysilicon plug.

Holding surrounding structure density constant, as T1 increases D1 increases and as T2 increases, D2 increases. In a first example, T1 is less than T2 and D1 is less than D2. In a second example, T1 is equal to T2 and D1 is equal to D2. In a third example, T1 and T2 are both the same and between about 100° F. to about 140° F. In a fourth example, T1 and T2 are both about 120° F.

In FIG. 3C, a recess etch is performed recessing a top surface 250A of polysilicon plug 240A a distance D3 below top surface 235 of pad nitride layer 210. A suitable recess etch process is a sulfur hexaflouride chemistry based plasma etch process. In FIG. 4C, a recess etch process identical to the recess etch process described in reference to FIG. 3C is performed recessing a top surface 250B of polysilicon plug 240B a distance D4 below top surface 235 of pad nitride layer 210. Because the recess etch processes are identical in FIGS. 3C and 4C, D3 minus D1 (see FIG. 3B) is about equal to D4 minus D2 (see FIG. 4B).

Figure 3D:
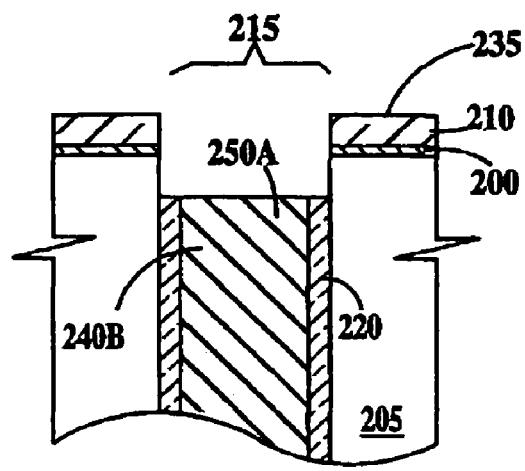
Figure 4D:
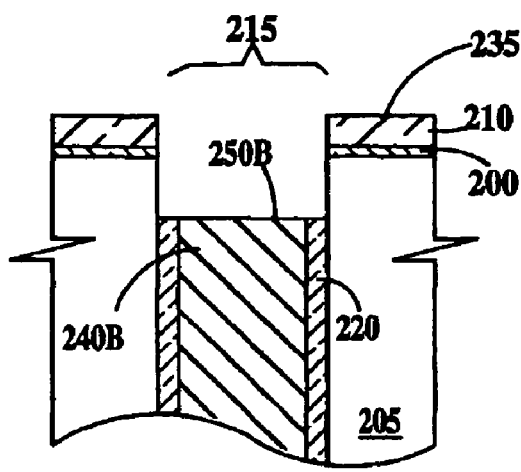

In both FIGS. 3D and 4D, a collar etch process (using, for example an aqueous dilute hydrofluoric acid based etch) is performed to remove collar oxide layer 220 wherever the collar oxide layer is not protected by polysilicon plug 250A in FIG. 3D and by polysilicon plug 250B in FIG. 4D.

Figure 3E:
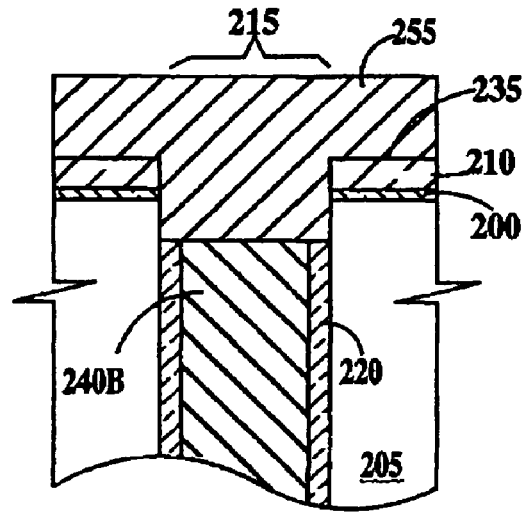
Figure 4E:
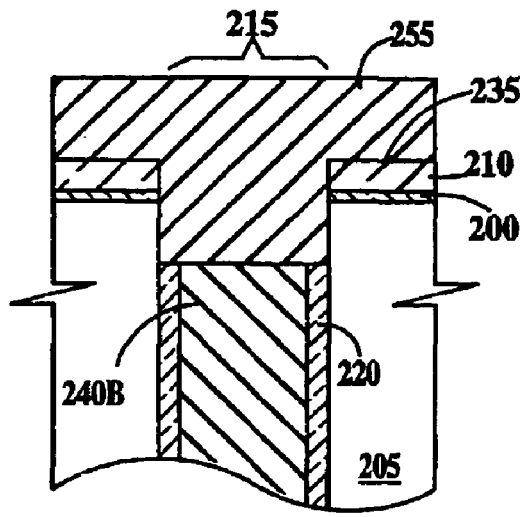

In both FIGS. 3E and 4E, a second layer of polysilicon 255 is deposited on a top surface 235 of pad nitride layer 210 of a sufficient depth to fill trench 215.

Figure 3F:
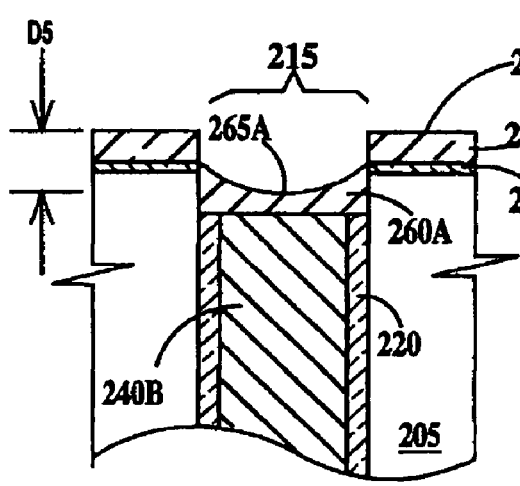

In FIG. 3F, a second CMP process maintained at a temperature T3 and using a slurry comprised of, for example, water, silicon oxide particles, tetramethyl ammonium hydroxide and aluminum sulfate is used to planarize polysilicon layer 255 (see FIG. 3E) forming second silicon plug 260A. During CMP some of pad nitride layer 210 is polished away as discussed infra. Also, during CMP a dished surface 265A whose depth of dishing D5 is a function of temperature T3 to a first order and the density of structures surrounding second polysilicon plug 260A to a second order is formed in the polysilicon plug.

Figure 4F:
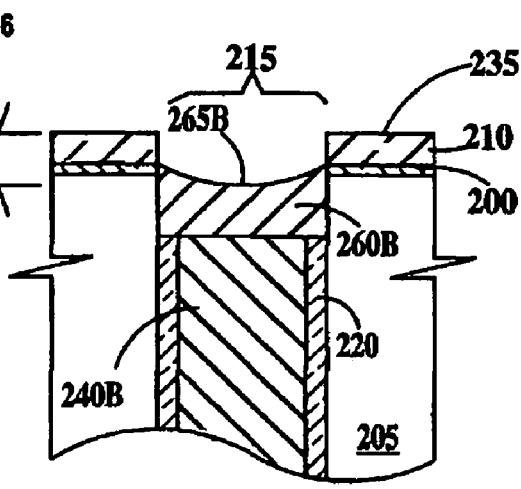

FIG. 4F is similar to FIG. 3F except a otherwise identical second CMP process to that described in reference to FIG. 3F maintained at a temperature T4 is used to planarize polysilicon layer 255 (see FIG. 4E) forming silicon plug 260B. Some of pad nitride layer 210 is polished away as discussed infra. Also, during CMP a dished surface 265B whose depth of dishing D6 is a function of temperature T4 to a first order and the density of structures surrounding polysilicon plug 260B to a second order is formed in the polysilicon plug.

Holding surrounding structure density constant, as T3 increase D5 increases and as T4 increases, D6 increases. In a first example, T3 is greater than T4 and D5 is greater than D6. In a second example, T3 is between about 100° F. to about 140° F. and T4 is between about 80° F. to about 100° F. In a third example, T3 is about 120° F. and T4 is about 90° F.

In FIG. 3G, recess etching (similar to that illustrated in FIG. 3C and described supra), photolithographic masking, trench etching and then photoresist removal steps are performed to form trenches 270A into substrate 205 (and a portion of first silicon plug 240A) and defining a buried strap 275A having a thickness D7. FIG. 4G is similar to FIG. 3G except a trench 270B is formed in substrate 205 (and a portion of first silicon plug 240B) to define a buried strap 275B having a thickness D8. In one example D8 is greater than D7.

In both FIGS. 3H and 4H, a dielectric layer 280 is deposited on a top surface 235 of pad nitride layer 210 of a sufficient depth to fill trenches 270A and 270B respectively.

In both FIGS. 3I and 4I, a CMP process is performed to substantially co-planarize a surface 285 of dielectric layer 280 with top surface 235 of pad nitride layer 210.

From the forgoing discussion, the thickness D7 of buried strap 275A (see FIG. 3G) is a function of CMP temperatures T1 and T3, and the thickness D8 of buried strap 275B (see FIG. 4G) is a function of CMP temperatures T2 and T4. Buried strap 275B (see FIG. 4G) is a thick buried strap because T2 is greater than T4. Buried strap 275A (see FIG. 3G) is a thin buried strap when T1 is equal to T3 and a very thin buried strap when T3 is greater than T1. The thickest buried straps are realized when the temperature of the first CMP process is greater than the temperature of the second CMP process. The thinnest buried straps are realized when the temperature of the first CMP process is less than the temperature of the second CMP process. Buried straps having thicknesses between the thickest and thinnest are realized when the temperature of the first CMP process is about equal to the temperature of the second CMP process. However, when uniformity of strap thickness across an array of devices is examined, it is found that the case of the thickest straps (the temperature of the first CMP process is greater than the temperature of the second CMP process) also provides a more uniform distribution of thickness than the thin and very thin sets of CMP process temperatures as described infra.

Figure 5:
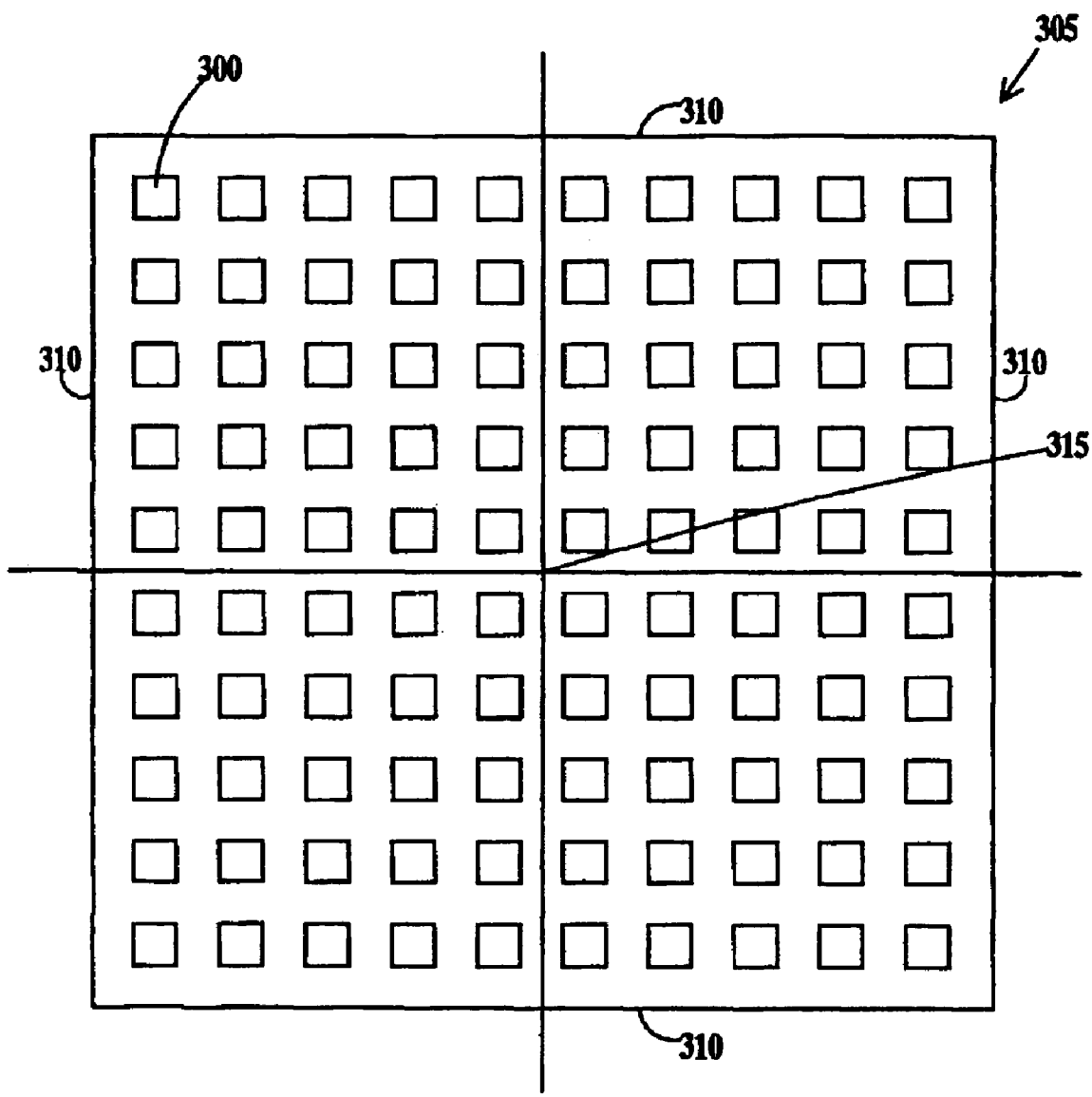
FIG. 5 is an illustration of an array of exemplary semiconductor structures.

FIG. 5 is an illustration of an array of exemplary semiconductor structures. In FIG. 5, a multiplicity of polysilicon filled trenches 300 are arranged in an array 305. Polysilicon filled trenches have been fabricated as illustrated in FIGS. 4A through 4I and described supra. Some of polysilicon trenches 300 are located close to edges 310 of array 305. Other polysilicon trenches are located close to a geometric center 315 of array 305. Since it highly unlikely that the density and distribution of other polysilicon filled trenches (if there are any) outside of array 305 is the same as the density and distribution of polysilicon filled trenches 300 within array 305, there will be a distribution of dishing which may be measured as a distribution of a CMP etch/polish stop layer thickness across array 305. In one example, polysilicon trenches 300 are trench capacitors. In a second example, polysilicon trenches 300 are trench capacitors having buried straps fabricated as illustrated in FIGS. 4A through 4I and described infra.

Figure 6:
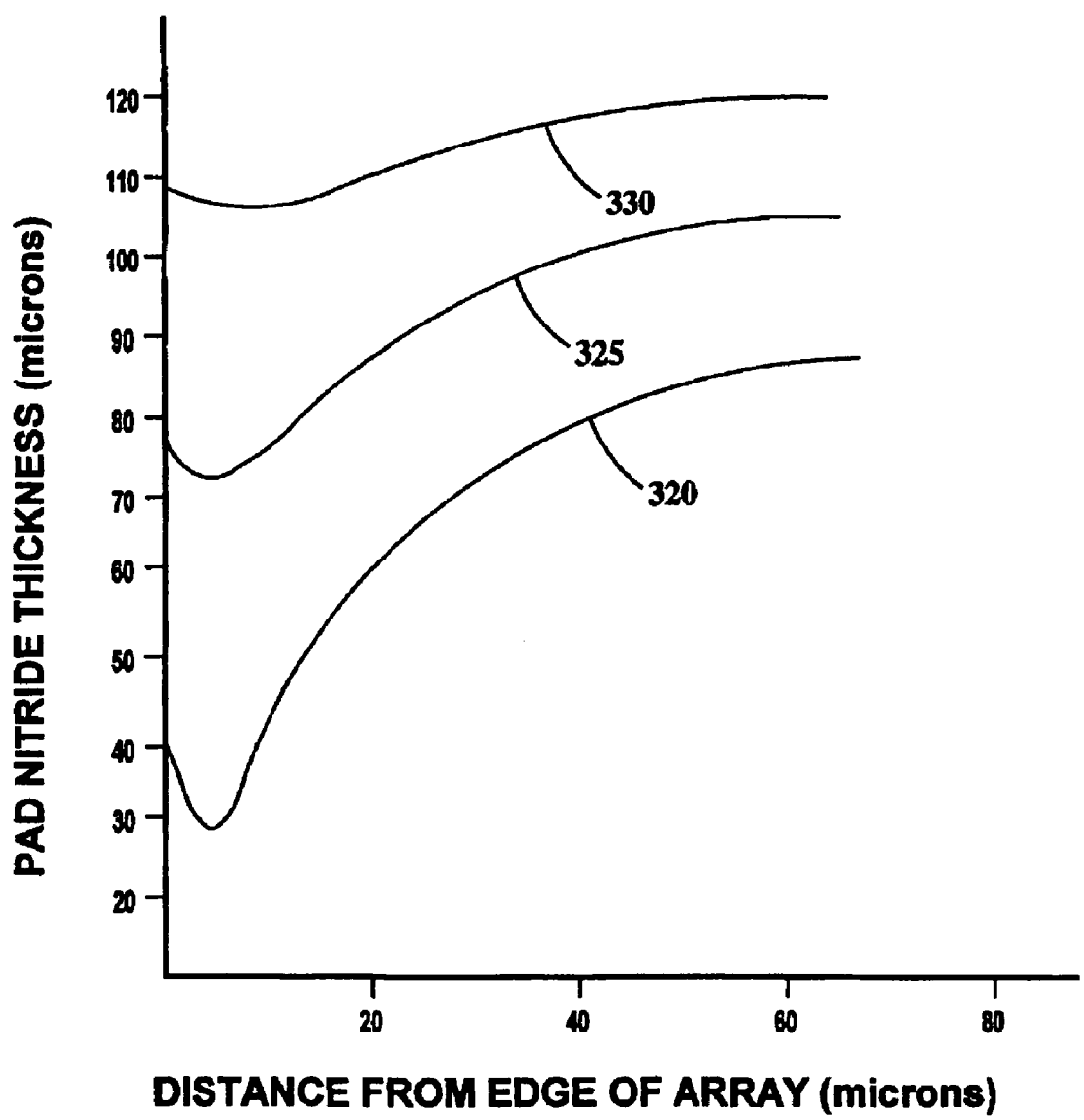
FIG. 6 is a plot of pad nitride thickness versus distance from an edge of an array of exemplary polysilicon structure for various chemical-mechanical-polish temperatures.

FIG. 6 is a plot of pad nitride thickness versus distance from an edge toward the center of an array of exemplary polysilicon structure for various chemical-mechanical-polish temperatures. Most CMP etch/polish stop materials (such as a silicon nitride layer in a polysilicon CMP process) are not 100% resistant to mechanical and chemical attack. Therefore, there is a removal of CMP etch/polish stop layers at a slower rate than the primary material being removed. The degree of dishing of polysilicon filled trenches and the thickness of buried straps may by the processes illustrated in FIGS. 3A through 3I and 4A through 4I and described supra, can be shown to correlate to the amount of CMP etch/polish stop material remaining. In FIG. 6, curve 320 is based on a second polysilicon CMP step (see FIGS. 4E and 4F) at a temperature of T3A, curve 325 is based on a second polysilicon CMP step (see FIGS. 4E and 4F) at a temperature of T3B and curve 330 is based on a second polysilicon CMP step (see FIGS. 4E and 4F) at a temperature of T3C where T3C is less than T3B and T3B is in turn less than T3A. Thus by lowering the temperature of the second polysilicon CMP step, the uniformity of the depth of polysilicon dishing is improved along with decreases in the absolute amounts of polysilicon dishing.

Figure 7:
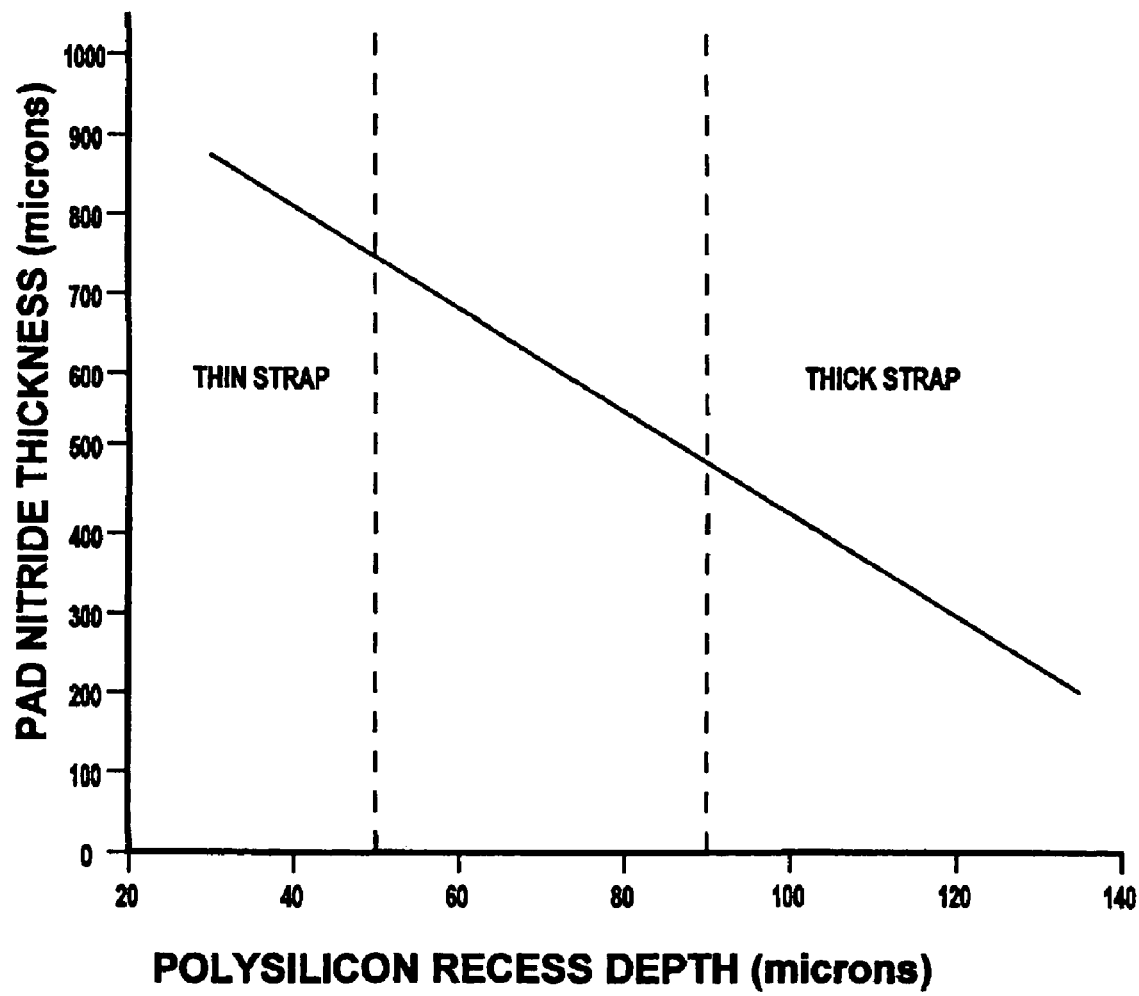
FIG. 7 is a plot of pad nitride thickness versus recess depth of an exemplary polysilicon structure.

FIG. 7 is a plot of pad nitride thickness versus recess depth of an exemplary polysilicon structure. FIG. 7 represents measurements made after the processes illustrated in step 4C and described supra have been completed. FIG. 7 illustrates that the amount of recess of a second layer of polysilicon correlates to the amount of CMP etch/polish stop material remaining. Since, the degree of dishing of polysilicon filled trenches and the thickness of buried straps may by the processes illustrated in FIGS. 3A through 3I and 4A through 4I and described supra, can be shown to correlate to the amount of CMP etch/polish stop material remaining, the polysilicon recess depth can be shown to correlate the degree of dishing of polysilicon filled trenches and the thickness of buried straps.

Figure 8:
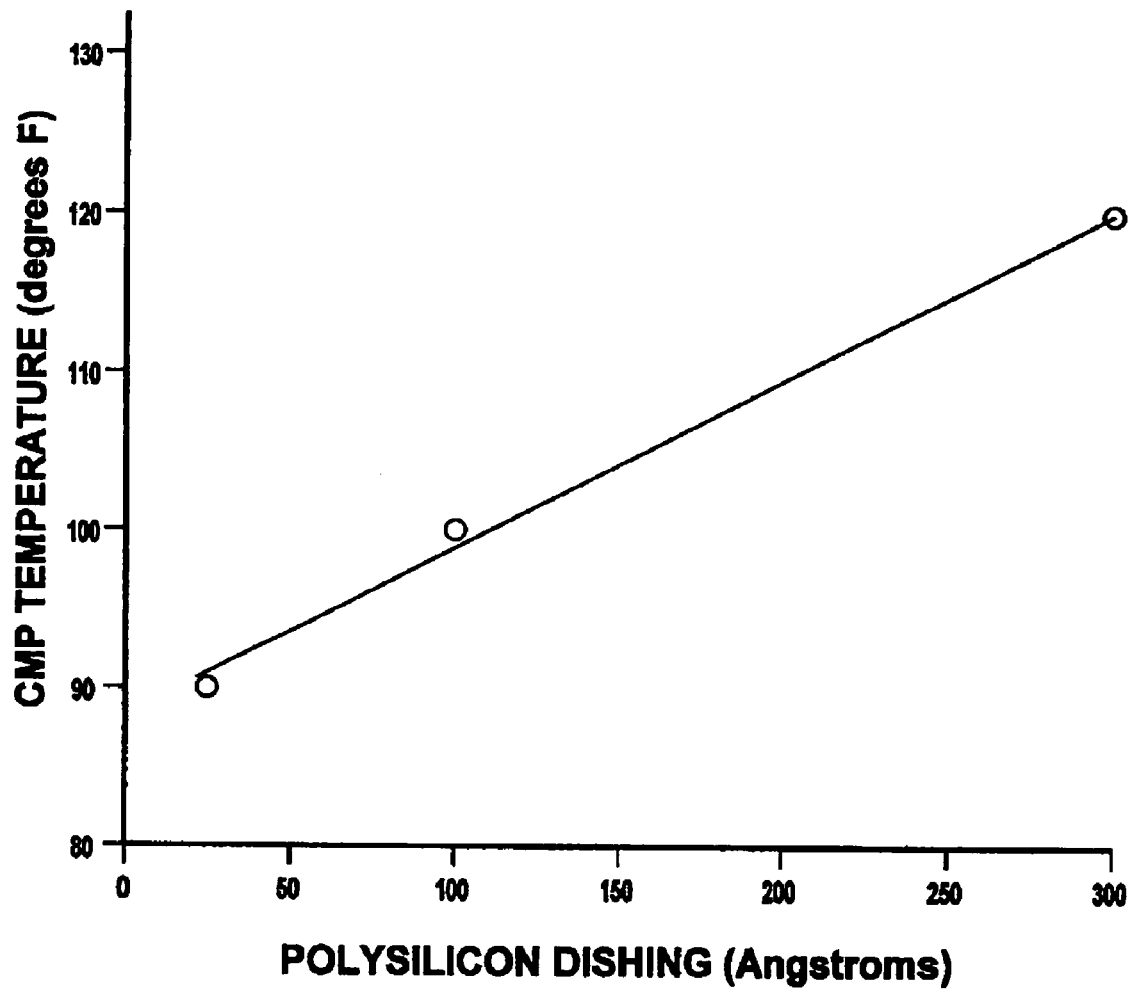
FIG. 8 is a plot of chemical mechanical polishing temperature versus dishing of an exemplary polysilicon structure.

FIG. 8 is a plot of chemical mechanical polishing temperature versus dishing of an exemplary polysilicon structure. FIG. 8 directly illustrates the relationship between depth of polysilicon dishing (as in FIGS. 3B, 3F, 4B and 4F) and CMP process temperature.

Figure 9:
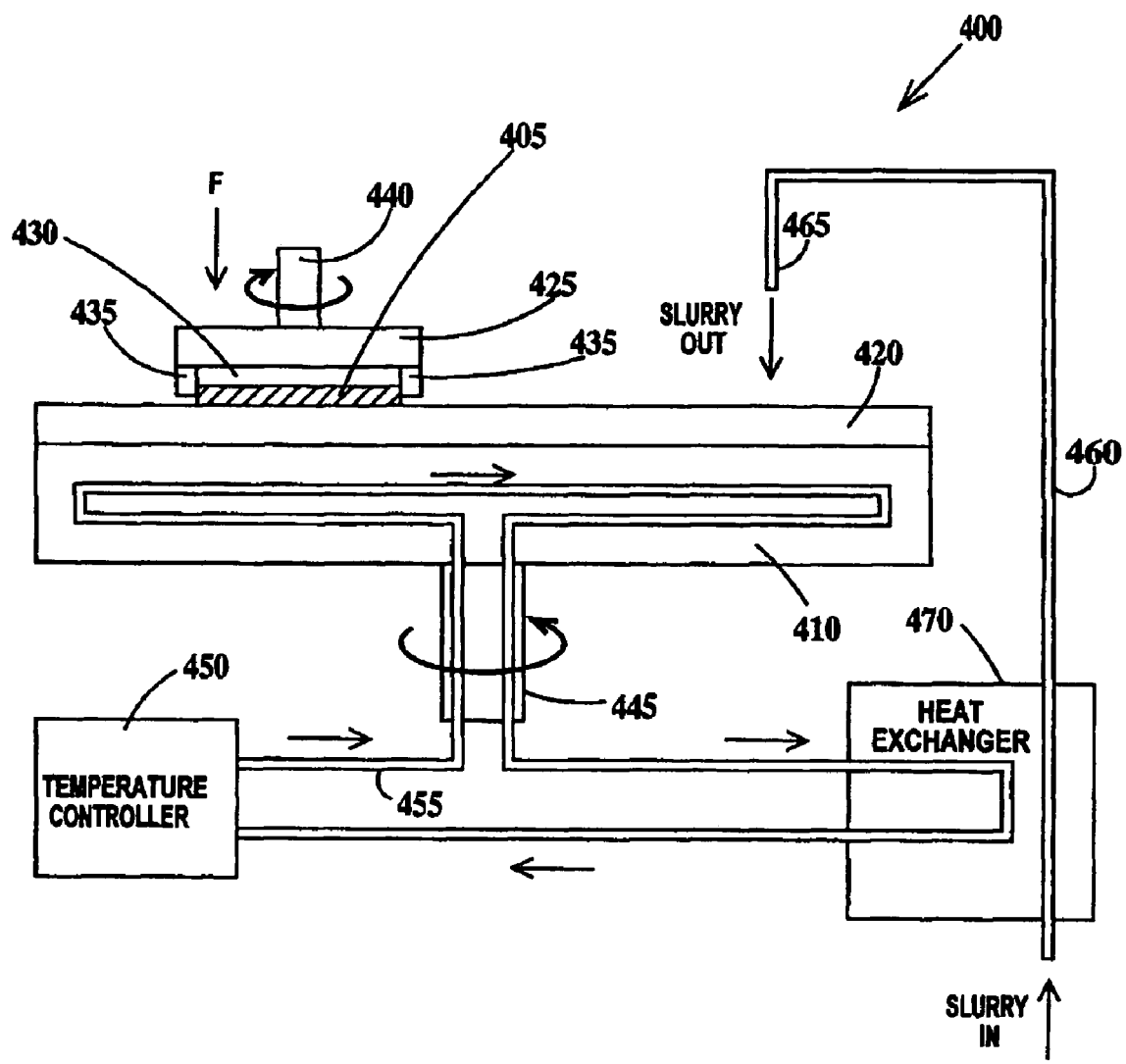
FIG. 9 is an exemplary chemical-mechanical-polish apparatus that may be used to practice the present invention.

FIG. 9 is an exemplary chemical-mechanical-polish apparatus that may be used to practice the present invention. In FIG. 9, a CMP apparatus 400 for planarization of a semiconductor substrate 405 placed face down on a pad 420 on a rotatable table 410. Pad 420 normally comprises a porous material. The pad material is capable of absorbing particulate matter such as silica or other abrasive materials.

Substrate 405 is held in a carrier 425. The backside of substrate 405 is held in contact with an insert pad 430 in carrier 425 by a vacuum. A retaining ring 435 is employed to prevent wafer 405 from slipping laterally from beneath carrier 425. A downward pressure "F" is applied by means of a shaft 440 attached to the backside of carrier 425. This pressure is used to facilitate CMP of the upper surface of substrate 405.

During operation, carrier 425 typically rotates in a circular motion relative to table 410. Rotational movement of carrier 425 may be provided by coupling a motor (not shown) to shaft 440. Table 410 also rotates by means of a shaft 445. Rotational movement of table 410 may be provided by coupling a motor (not shown) to shaft 445. In one example, the relative rotational movements of carrier 425 and table 410 are counter-directional and, carrier 425 remains in a stationary position relative to shaft 445.

CMP apparatus 400 further includes temperature controller 450 for heating a heat transfer fluid and pumping the heat transfer fluid through a pipe 455. Pipe 455 passes through the interior of table 410 so that the temperature of table 410 may be increased above room temperature during the polishing process.

CMP apparatus 400 further includes a pipe 460 for delivering slurry onto the surface of pad 420 during polishing. An exemplary slurry is a liquid suspension of abrasive particles, chemical etchants, and other chemicals in a carrier liquid, often water. After being pumped thorough pipe 460, the slurry is directed onto the surface of pad 420 by nozzle 465. In an optional embodiment, the slurry is likewise heated by temperature controller 450 through a heat exchanger 470. Heat exchanger 470 thermally couples portions of pipes 455 and 460 together so that the slurry passing through pipe 460 is maintained at the same temperature as that of the heating fluid flowing through pipe 455.

Two tools similar to CMP apparatus 400 may be provided for practicing the present invention. The first tool reserved for performing a first polysilicon CMP process as illustrated in FIGS. 4A and 4B as described supra with its temperature controller set at a first temperature and the second tool reserved for performing a second polysilicon CMP process as illustrated in FIGS. 4E and 4F as described supra with its temperature controller set at a second temperature, the first temperature higher than the second temperature.

Thus the present invention provides a chemical mechanical polishing processes with improved vertical dimension control.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating a structure, comprising:
   (a) forming a trench in a substrate;
   (b) depositing a first layer of polysilicon on a surface of said substrate, said first layer of polysilicon filling said trench;
   (c) chemical-mechanical-polishing said first layer of polysilicon at a first temperature to expose said surface of said substrate;
   (d) removing an upper portion of said first layer of polysilicon from said trench;
   (e) depositing a second layer of polysilicon on said surface of said substrate, said second layer of polysilicon filling said trench; and
   (f) chemical-mechanical-polishing said second layer of polysilicon at a second temperature to expose said surface of said substrate, said second temperature different from said first temperature.

2. The method of claim 1, wherein said first temperature is about 120° F. and said second temperature is about 90° F.

3. The method of claim 1, wherein said first temperature is higher than said second temperature.

4. The method of claim 3, wherein step (c) includes dispensing a first slurry at said first temperature onto a first polishing pad at said first temperature and step (f) includes dispensing a second slurry at said second temperature onto a second polishing pad at said second temperature.

5. The method of claim 1 wherein said first temperature is between about 100° F. to about 140° F. and said second temperature is between about 80° F. to about 100° F.

6. The method of claim 1,
   wherein said substrate includes an uppermost polishing stop layer, a top surface of said polishing stop layer being said surface of said substrate; and
   step (a) includes forming said trench through said polishing stop layer.

7. A method of fabricating a structure, comprising:
   (a) forming a trench in a substrate;
   (b) depositing a first layer of polysilicon on a surface of said substrate, said first layer of polysilicon filling said trench;
   (c) chemical-mechanical-polishing said first layer of polysilicon at a first temperature to expose said surface of said substrate by pressing a top surface of said first layer of polysilicon against a rotating first polishing pad while dispensing a first slurry on a top surface of said first polishing pad, said first polishing pad maintained at said first temperature;
   (d) removing an upper portion of said first layer of polysilicon from said trench;
   (e) depositing a second layer of polysilicon on said surface of said substrate, said second layer of polysilicon filling said trench; and
   (f) chemical-mechanical-polishing said second layer of polysilicon at a second temperature to expose said surface of said substrate, said second temperature different from said first temperature; by pressing a top surface of said second layer of polysilicon against a rotating second polishing pad while dispensing a second slurry on a top surface of said second polishing pad, said second polishing pad maintained at said second temperature.

8. The method of claim 7, wherein said first temperature is higher than said second temperature.

9. The method of claim 7, wherein said first temperature is between about 100° F. to about 140° F. and said second temperature is between about 80° F. to about 100° F.

10. The method of claim 7, wherein said first temperature is about 120° F. and said second temperature is about 90° F.

11. The method of claim 7, wherein step (a) is followed by step (b), step (b) is followed by step (c), step (c) is followed by step (d), step (d) is followed by step (e) and step (e) is followed by step (f).

12. The method of claim 7, wherein said first layer of polysilicon comprises N-doped polysilicon and said second layer of polysilicon comprises N-doped polysilicon.

13. The method of claim 7,
    wherein said substrate includes an uppermost polishing stop layer, a top surface of said polishing stop layer being said surface of said substrate; and
    step (a) includes forming said trench through said polishing stop layer.

14. The method of claim 7, further including, between steps (a) and (b), forming a dielectric layer on a sidewall of said trench.

15. The method of claim 7, further including:
    dispensing said first slurry at said first temperature; and
    dispensing said second slurry at said first temperature.

16. A method of fabricating a structure, comprising:
    (a) forming an array of trenches in a substrate;
    (b) depositing a first layer of polysilicon on a surface of said substrate, said first layer of polysilicon filling said trenches;
    (c) chemical-mechanical-polishing said first layer of polysilicon at a first temperature to expose said surface of said substrate, said first layer of polysilicon in said trenches dished into said trench a first distance from surface of said substrate by said chemical-mechanical-polishing of said first layer of polysilicon;
    (d) removing an upper portion of said first polysilicon from each of said trenches;
    (e) depositing a second layer of polysilicon on said surface of said substrate, said second layer of polysilicon filling said trenches; and
    (f) chemical-mechanical-polishing said second layer of polysilicon at a second temperature to expose said surface of said substrate, said second temperature different from said first temperature, said second layer of polysilicon in said trenches dished into said trench a second distance from surface of said substrate by said chemical-mechanical-polishing of said second layer of polysilicon, said first distance greater than said second distance.

17. The method of claim 16, wherein said first temperature is higher than said second temperature.

18. The method of claim 17, wherein step (c) includes dispensing a first slurry at said first temperature onto a first polishing pad at said first temperature and step (f) includes dispensing a second slurry at said second temperature onto a second polishing pad at said second temperature.

19. The method of claim 16, wherein said first temperature is between about 100° F. to about 140° F. and said second temperature is between about 80° F. to about 100° F.

20. The method of claim 16,
wherein said substrate includes an uppermost polishing stop layer, a top surface of said polishing stop layer being said surface of said substrate; and
step (a) includes forming said trench through said polishing stop layer.

21. A method of fabricating a structure, comprising:
(a) forming an array of trenches in a substrate;
(b) depositing a first layer of polysilicon on a surface of said substrate, said first layer of polysilicon filling said trenches;
(c) chemical-mechanical-polishing said first layer of polysilicon at a first temperature to expose said surface of said substrate, said first layer of polysilicon in said trenches dished into said trench a first distance from surface of said substrate by pressing a top surface of said first layer of polysilicon against a rotating first polishing pad while dispensing a first slurry on a top surface of said first polishing pad, said first polishing pad maintained at said first temperature;
(d) removing an upper portion of said first polysilicon from each of said trenches;
(e) depositing a second layer of polysilicon on said surface of said substrate, said second layer of polysilicon filling said trenches; and
(f) chemical-mechanical-polishing said second layer of polysilicon at a second temperature to expose said surface of said substrate, said second temperature different from said first temperature, said second layer of polysilicon in said trenches dished into said trench a second distance from surface of said substrate, said first distance greater than said second distance by pressing a top surface of said second layer of polysilicon against a rotating second polishing pad while dispensing a second slurry on a top surface of said second polishing pad, said second polishing pad maintained at said second temperature.

22. The method of claim 21, wherein said first temperature is higher than said second temperature.

23. The method of claim 21, wherein said first temperature is between about 100° F. to about 140° F. and said second temperature is between about 80° F. to about 100° F.

24. The method of claim 21, wherein said first temperature is about 120° F. and said second temperature is about 90° F.

25. The method of claim 21, wherein step (a) is followed by step (b), step (b) is followed by step (c), step (c) is followed by step (d), step (d) is followed by step (e) and step (e) is followed by step (f).

26. The method of claim 21, wherein said first layer of polysilicon comprises N-doped polysilicon and said second layer of polysilicon comprises N-doped polysilicon.

27. The method of claim 21,
wherein said substrate includes an uppermost polishing stop layer, a top surface of said polishing stop layer being said surface of said substrate; and
step (a) includes forming said trench through said polishing stop layer.

28. The method of claim 21, further including, between steps (a) and (b), forming a dielectric layer on sidewalls of said trenches.

29. The method of claim 21, further including:
dispensing said first slurry at said first temperature; and
dispensing said second slurry at said first temperature.

30. A method of fabricating memory cell, comprising:
(a) forming a trench in a substrate and forming a dielectric layer on a sidewall of said trench;
(b) depositing a first layer of polysilicon on a surface of said substrate, said first layer of polysilicon filling said trench;
(c) chemical-mechanical-polishing said first layer of polysilicon at a first temperature to expose said surface of said substrate;
(d) removing an upper portion of said first polysilicon from said trench;
(e) depositing a second layer of polysilicon on said surface of said substrate, said second layer of polysilicon filling said trench;
(f) chemical-mechanical-polishing said second layer of polysilicon at a second temperature to expose said surface of said substrate, said second temperature different from said first temperature;
(g) removing an upper portion of said second layer of polysilicon from said trench and refilling said trench with an insulator; and
(h) forming a NFET in said substrate and adjacent to said trench, a source of said NFET in physical and electrical contact with said second layer of polysilicon in said trench.

31. The method of claim 30, wherein said first temperature is higher than said second temperature.

32. The method of claim 30, wherein said first temperature is between about 100° F. to about 140° F. and said second temperature is between about 80° F. to about 100° F.

33. The method of claim 30, wherein step (a) is followed by step (b), step (b) is followed by step (c), step (c) is followed by step (d), step (d) is followed by step (e) and step (e) is followed by step (f).

34. The method of claim 30, wherein said first layer of polysilicon comprises N-doped polysilicon and said second layer of polysilicon comprises N-doped polysilicon.

35. The method of claim 30,
wherein said substrate includes an uppermost polishing stop layer, a top surface of said polishing stop layer being said surface of said substrate; and
step (a) includes forming said trench through said polishing stop layer.

36. The method of claim 30, further including, forming a heavily doped N+ region in said substrate adjacent to a lower portion of said dielectric layer on said sidewall of said trench.

37. The method of claim 30,
step (c) further including: pressing a top surface of said first layer of polysilicon against a rotating first polishing pad while dispensing a first slurry on a top surface of said first polishing pad, said first polishing pad maintained at said first temperature; and
step (f) further including: pressing a top surface of said second layer of polysilicon against a rotating second polishing pad while dispensing a second slurry on a top surface of said second polishing pad, said second polishing pad maintained at said second temperature.

38. The method of claim 37, further including:
dispensing said first slurry at said first temperature; and
dispensing said second slurry at said second temperature.

* * * * *